(12) United States Patent
Nakayama et al.

(10) Patent No.: US 11,037,757 B2
(45) Date of Patent: Jun. 15, 2021

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventors: Takahito Nakayama, Chigasaki (JP); Yuji Abe, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/782,156

(22) Filed: Feb. 5, 2020

(65) Prior Publication Data
US 2020/0258715 A1 Aug. 13, 2020

(30) Foreign Application Priority Data
Feb. 8, 2019 (JP) .............................. JP2019-021742

(51) Int. Cl.
*H01J 37/317* (2006.01)
*H01J 37/304* (2006.01)
(52) U.S. Cl.
CPC ........ *H01J 37/304* (2013.01); *H01J 37/3174* (2013.01)
(58) Field of Classification Search
CPC .............................. H01J 37/304; H01J 37/3174
See application file for complete search history.

(56) References Cited

U.S. PATENT DOCUMENTS

| | | | | |
|---|---|---|---|---|
| 4,583,298 A | * | 4/1986 | Raugh ................. | G01B 11/002 33/1 CC |
| 7,449,699 B1 | * | 11/2008 | Adams ................. | H01J 37/228 250/307 |

(Continued)

FOREIGN PATENT DOCUMENTS

| | | |
|---|---|---|
| JP | 2001-265012 A | 9/2001 |
| JP | 2004-296939 A | 10/2004 |

(Continued)

*Primary Examiner* — Sean M Luck
(74) *Attorney, Agent, or Firm* — Oblon, McClelland, Maier & Neustadt, L.L.P.

(57) ABSTRACT

A charged particle beam writing apparatus includes a writer writing a pattern on a surface of a substrate using a charged particle beam, a measurement unit measuring a height of the surface of a central portion of the substrate at a plurality of positions in the central portion, a generator performing fitting using a first polynomial on measurement values from the measurement unit, calculating, by extrapolation using the first polynomial, a first height distribution of the height of the surface of a peripheral portion of the substrate, performing fitting using a second polynomial, which is of a higher order than the first polynomial, on the measurement values, calculating a second height distribution of the height of the surface of the central portion by interpolation using the second polynomial, and generating a height distribution of the substrate by combining the first height distribution and the second height distribution, and a controller adjusting a focal position of the charged particle beam based on the height of the surface at a writing position, the height being calculated from the height distribution of the substrate.

9 Claims, 9 Drawing Sheets

(56) References Cited

U.S. PATENT DOCUMENTS

| | | | |
|---|---|---|---|
| 8,013,299 B2* | 9/2011 | Obara | H01J 37/28 250/307 |
| 2004/0211899 A1* | 10/2004 | Ezumi | H01J 37/265 250/310 |
| 2004/0227916 A1 | 11/2004 | Kono et al. | |
| 2005/0214657 A1 | 9/2005 | Mitsui | |
| 2006/0169927 A1* | 8/2006 | Muraki | H01J 37/304 250/492.23 |
| 2007/0103657 A1* | 5/2007 | Yoshitake | G03F 7/707 355/52 |
| 2007/0103659 A1 | 5/2007 | Yoshitake et al. | |
| 2007/0272858 A1* | 11/2007 | Tanimoto | H01J 37/28 250/310 |
| 2009/0039285 A1* | 2/2009 | Cooper | H01J 37/20 250/442.11 |
| 2010/0207017 A1* | 8/2010 | Horiuchi | H01J 37/3174 250/252.1 |
| 2012/0193553 A1* | 8/2012 | Touya | B82Y 10/00 250/492.22 |
| 2012/0295202 A1* | 11/2012 | Sano | B82Y 10/00 430/296 |
| 2013/0022900 A1 | 1/2013 | Tanabe | |

FOREIGN PATENT DOCUMENTS

| | | |
|---|---|---|
| JP | 2005-274953 A | 10/2005 |
| JP | 2007-150286 A | 6/2007 |
| WO | WO 2011/122608 A1 | 10/2011 |

* cited by examiner

CHARGED PARTICLE BEAM WRITING APPARATUS AND CHARGED PARTICLE BEAM WRITING METHOD

CROSS REFERENCE TO RELATED APPLICATION

This application is based upon and claims benefit of priority from the Japanese Patent Application No. 2019-021742, filed on Feb. 8, 2019, the entire contents of which are incorporated herein by reference.

FIELD

The present invention relates to a charged particle beam writing apparatus and a charged particle beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In a case where a pattern is written on a substrate using an electron beam writing apparatus, in order to avoid a shift in a writing position and a shift in the focal point of an electron beam, the electron beam has been made to converge on a surface of the substrate by measuring the accurate height of the surface of the substrate and adjusting lenses in accordance with the measured height. For example, using a height measurement unit of the electron beam writing apparatus, before writing, the surface of the substrate is irradiated with light, the reflected light is detected, the height of the surface of the substrate is measured at a plurality of points on the surface, an approximate curved surface of the surface of the substrate is calculated using a cubic polynomial or the like on the basis of the measurement result, and a height distribution (a Z map) is generated. Depending on the configuration of the writing apparatus, there is a region having a surface the height of which cannot be measured such as a peripheral portion of the substrate, and this region has been dealt with by polynomial extrapolation.

However, the error between a Z map obtained by polynomial approximation and the actual height of the surface of the substrate may reduce the accuracy of writing. In order to reduce the error, it is conceivable that the order of the polynomial will be increased; however, in a case where the order is increased, there may be a case where the error in an extrapolated portion (an area outside a measurement area such as a peripheral portion of the substrate) is even increased and the accuracy of writing is reduced.

DETAILED DESCRIPTION

In one embodiment, a charged particle beam writing apparatus includes a writing a pattern on a surface of a substrate using a charged particle beam; a measurement unit measuring a height of the surface of a central portion of the substrate at a plurality of positions in the central portion; a generator performing fitting using a first polynomial on measurement values from the measurement unit, calculating, by extrapolation using the first polynomial, a first height distribution of the height of the surface of a peripheral portion of the substrate, performing fitting using a second polynomial, which is of a higher order than the first polynomial, on the measurement values, calculating a second height distribution of the height of the surface of the central portion by interpolation using the second polynomial, and generating a height distribution of the substrate by combining the first height distribution and the second height distribution; and a controller adjusting a focal position of the charged particle beam based on the height of the surface at a writing position, the height being calculated from the height distribution of the substrate.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
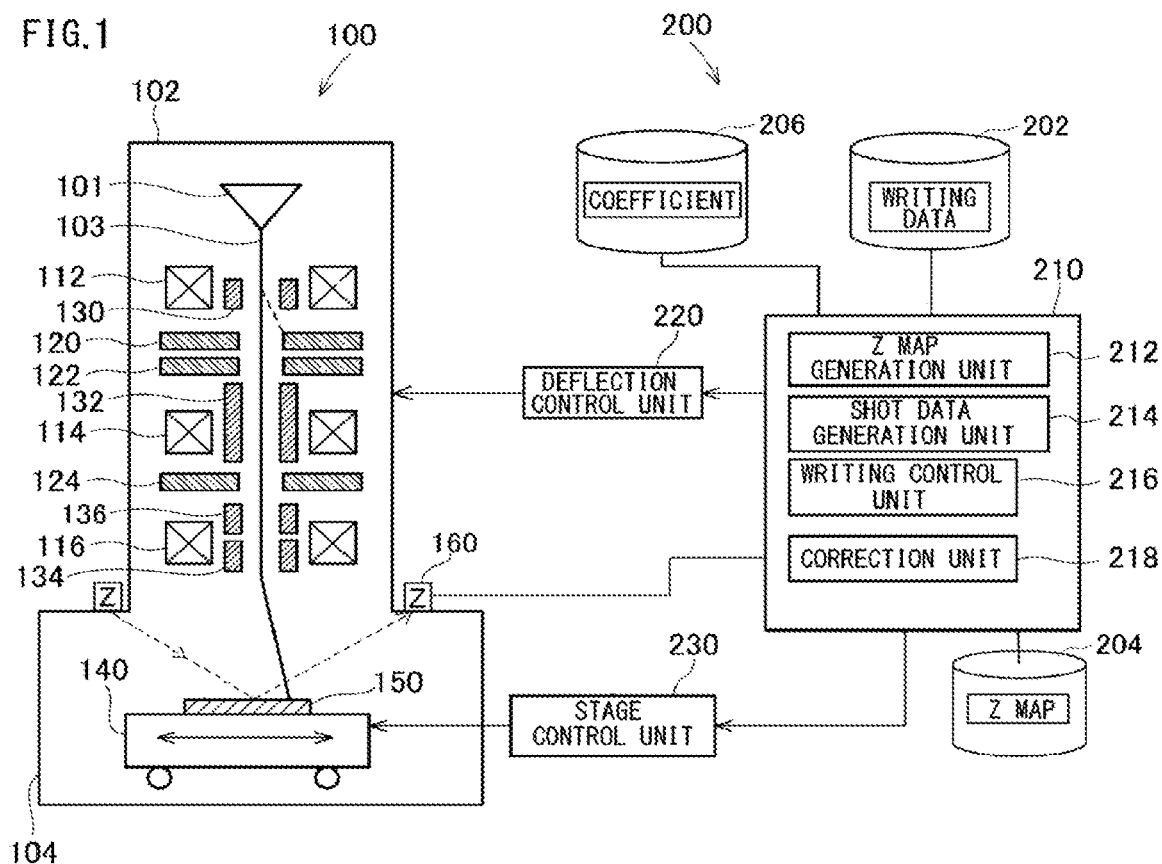
FIG. 1 is a schematic diagram of a charged particle beam writing apparatus according to an embodiment of the present invention.

A writing apparatus illustrated in FIG. 1 includes a writing unit 100 (a writer), which writes a desired pattern by irradiating an object such as a mask or a wafer with an electron beam, and a control unit 200, which controls a writing operation performed by the writing unit 100. The writing unit 100 has an electron beam column 102 and a writing chamber 104.

In the electron beam column 102, an electron gun 101, an illuminating lens 112, a projection lens 114, an objective lens 116, a blanking aperture 120, a first aperture 122, a second aperture 124, a blanking deflector 130, a shaping deflector 132, a main deflector 134, and a sub-deflector 136 are arranged.

In the writing chamber 104, an XY stage 140, which is movably arranged, is arranged. A substrate 150, which is a writing target, is placed on the XY stage 140. The substrate 150 includes a wafer and an exposure mask for transferring a pattern onto the wafer. In addition, this mask includes mask blanks, on which no pattern has been formed yet.

In the writing chamber 104, a Z sensor 160 (a height measurement unit) is provided, which has an irradiation unit that emits laser light obliquely from above the substrate 150 to a surface of the substrate 150, and a light reception unit that receives the laser light reflected by the surface of the substrate 150.

The control unit 200 includes storage devices 202, 204, and 206, a control computer 210, a deflection control unit 220, and a stage control unit 230. The storage devices 202, 204, and 206 are, for example, a magnetic disk apparatus. In the storage device 202, writing data is stored. In this writing data, the shape and position of a graphic pattern are defined.

The control computer 210 includes a Z map generating unit 212 (a Z map generator), a shot data generating unit 214 (a shot data generator), a writing control unit 216 (a writing controller), and a correction unit 218. The function of each of the Z map generating unit 212, the shot data generating unit 214, the writing control unit 216, and the correction unit 218 may be configured by software or may also be configured by hardware.

An electron beam 103 emitted from the electron gun 101 is caused to illuminate the entirety of the first aperture 122 having a rectangular hole by the illuminating lens 112. In this case, the electron beam 103 is formed in a rectangular shape. The electron beam 103 passing through the first aperture 122 to form a first aperture image is projected onto the second aperture 124 by the projection lens 114. The position of the first aperture image on the second aperture 124 is deflected and controlled by the shaping deflector 132, and the beam shape and size can be varied. The electron beam 103 passed through the second aperture 124 to have a second aperture image is brought into focus by the objective lens 116, deflected by the main deflector 134 and the sub-deflector 136, and applied to a desired point on the substrate 150 on the XY stage 140, which is continuously moved.

The electron beam 103 emitted from the electron gun 101 is deflected by the blanking deflector 130 in such a manner that the beam passes through the blanking aperture 120 in a beam-on state, and is entirely blocked by the blanking aperture 120 in a beam-off state. The electron beam that has passed through the blanking aperture 120 after transition from the beam-off state to the beam-on state before being turned off is defined as one electron-beam shot. The amount of irradiation per electron-beam shot with which the substrate 150 is irradiated is adjusted by an irradiation time of each shot.

Figure 2:
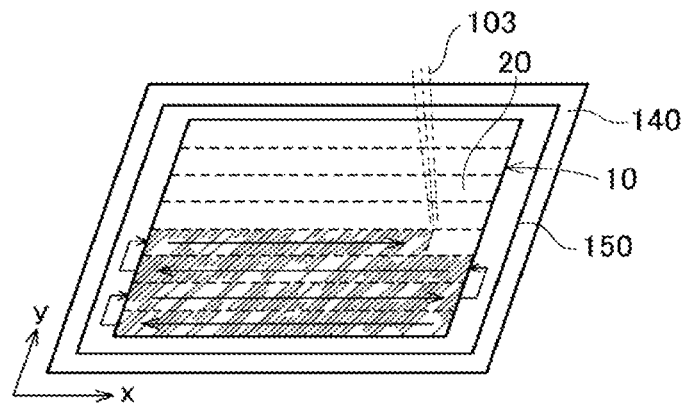
FIG. 2 is a diagram illustrating an example of stage movement.

FIG. 2 is a diagram illustrating an example of stage movement at the time of pattern writing. In a case where writing is performed on the substrate 150, while the XY stage 140 is being continuously moved in the x direction for example, a writing area 10 is virtually divided into a plurality of strip-shaped stripes (frames) 20, which have a width across which the electron beam 103 can be deflected, and one of the stripes 20 on the substrate 150 is irradiated with the electron beam 103. Continuous movement can shorten a writing time. After writing is completed on the stripe 20, the XY stage 140 is step fed in the y direction, and a writing operation is performed for the next stripe 20 in the x direction (the opposite direction).

The moving speed of the XY stage 140 may be constant or variable. For example, the speed may be changed depending on the pattern density of a writing pattern. For example, the moving speed of the stage is slowed down when a dense pattern is written, and the moving speed of the stage is increased when a coarse pattern is written.

The width of the stripe 20 is a width across which deflection by the main deflector 134 is possible. For the individual stripes 20, the width in the y direction is also partitioned so as to have the same width as the width of the stripes in the x direction. This partitioned area is a main deflection area, over which deflection by the main deflector 134 is possible. Areas obtained by fragmenting this main deflection area are sub-deflection areas.

The sub-deflector 136 is used to control the position of the electron beam 103 for each shot at high speed and with high accuracy. Thus, the deflection range of the sub-deflector 136 is limited to a sub-deflection area, and deflection beyond the area is performed by moving the position of the sub-deflection area with the main deflector 134. In contrast, the main deflector 134 is used to control the position of a sub-deflection area, and moves within a region (a main deflection area) including a plurality of sub-deflection areas. In addition, since the XY stage 140 is continuously moving in the x direction during writing, a writing starting point of a sub-deflection area can be caused to follow the movement of the XY stage 140 by the main deflector 134 moving (tracking) the writing starting point as necessary.

Figure 3:
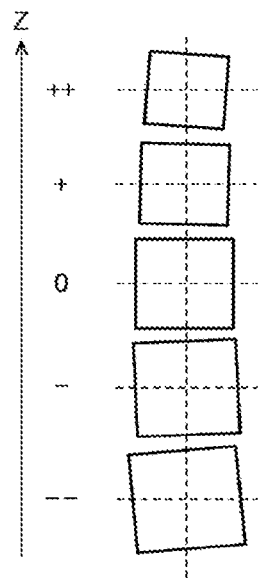
FIG. 3 is a diagram illustrating an example of a change in the shape of a main deflection area.

In an electron beam writing apparatus, a lens system is adjusted such that a focus height position (Z=0) matches the surface of the substrate 150. In a case where the height of the substrate 150 shifts from the focus height position, as illustrated in FIG. 3, the shape of the main deflection area on the surface of the substrate may rotate or may expand or contract. In the example illustrated in FIG. 3, as the height of the surface of the substrate shifts in a negative direction (the direction away from the lens system), the main deflection area gradually rotates counterclockwise and its area size increases. In contrast, as the height of the surface of the substrate shifts in a positive direction (the direction toward the lens system), the main deflection area gradually rotates clockwise and its area size decreases.

Rotation and expansion-contraction of the shape of the main deflection area result in a writing position shift. Thus, the height distribution of the surface of the substrate 150 (a Z map) is generated in advance, and optical system correction (focusing and correction of expanding-contracting and rotation of the shape of the main deflection area) is performed in accordance with the height at a writing position.

A Z map generation method according to the present embodiment will be described using the flow chart illustrated in FIG. 4. First, the height of the surface of the substrate 150 is measured at a plurality of points on the surface using the Z sensor 160 (step S101). FIG. 5 illustrates an example of a measurement result. For example, the height of the surface of the substrate 150 is measured at 8×8 points.

Figure 6A:
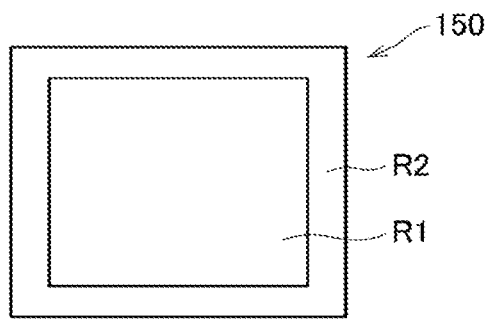
FIG. 6A illustrates a surface height measurement region.

A substrate anti-static cover (not illustrated) is placed on the substrate 150, and this cover is positioned above the periphery portion of the substrate 150, serves as a canopy, and prevents the periphery portion of the substrate 150 from being irradiated with laser light output from the Z sensor 160. Thus, as illustrated in FIG. 6A, the height of a central portion R1 of the substrate 150 (the writing area 10) can be measured by the Z sensor 160; however, the height of a peripheral portion R2 cannot be measured by the Z sensor 160.

Figure 6B:
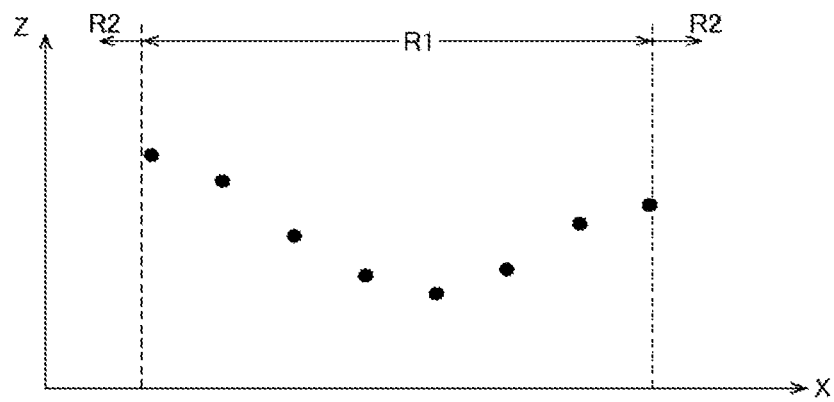
FIG. 6B illustrates an example of a measurement result of the height of the surface of the substrate.

As illustrated in FIG. 6B, measurement values of the height of the surface can be obtained only at the central portion R1. FIG. 6B illustrates an example of the distribution of x-direction height measurement values in a case where a y coordinate is fixed.

Figure 6C:
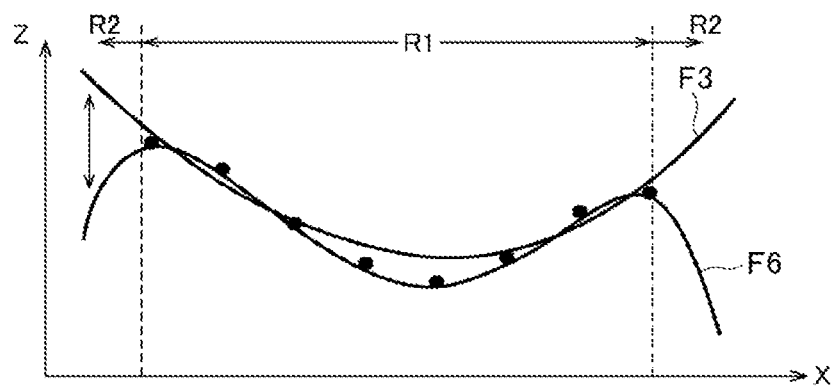
FIG. 6C is a diagram illustrating an approximate polynomial.

Hitherto, an approximate curved surface (a polynomial) has been calculated using height measurement values (actual measured values) in the central portion R1, and the peripheral portion R2 has been dealt with by polynomial extrapolation. For example, as illustrated in FIG. 6C, the actual measured values are approximated using a cubic polynomial F3.

However, it may be possible that an approximation error is not sufficiently small when a low-order polynomial as low as a cubic polynomial is used. An approximation error can be made smaller by using a higher-order polynomial. For example, the error can be made smaller when approximation is performed using a sextic polynomial F6 than using the cubic polynomial F3.

However, when a high-order polynomial is used, an error becomes large at the peripheral portion R2 (an extrapolation portion). Thus, in the present embodiment, when a Z map is generated, for the peripheral portion R2, for which the height of the surface cannot be measured, the error is prevented from becoming larger by using a low-order (for example, cubic) polynomial extrapolation, and for the central portion R1, for which the height of the surface can be measured, the approximation error is made smaller by using a high-order (for example, sextic) polynomial.

Figure 7A:
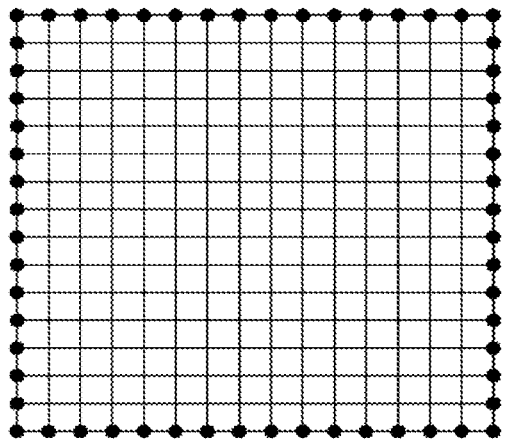
FIGS. 7A to 7C are diagrams illustrating an example of a Z map.

The Z map generating unit 212 performs fitting on measurement values obtained in step S101 using a low-order polynomial and calculates an approximate curved surface (step S102), and generates a Z map of the peripheral portion R2 by extrapolation using this approximate curved surface (step S103). For example, as illustrated in FIG. 7A, an outermost peripheral portion of the Z map is generated in which 16 Z values are aligned in each of the x and y directions.

Figure 7B:
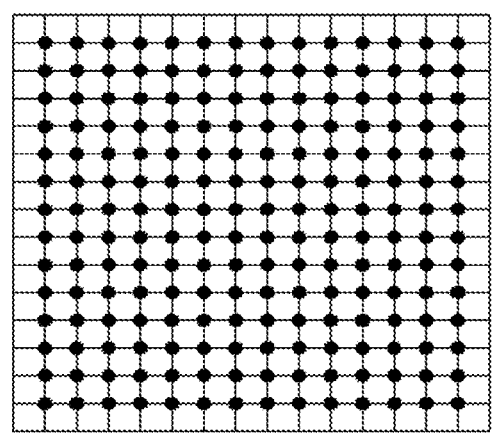

Next, the Z map generating unit 212 performs fitting on the measurement values obtained in step S101 using a high-order polynomial, calculates an approximate curved surface (step S104), and generates a Z map of the central portion R1 by interpolation using this approximate curved surface (step S105). For example, a Z map central portion is generated in which 14×14 Z values are aligned as illustrated in FIG. 7B.

Figure 7C:
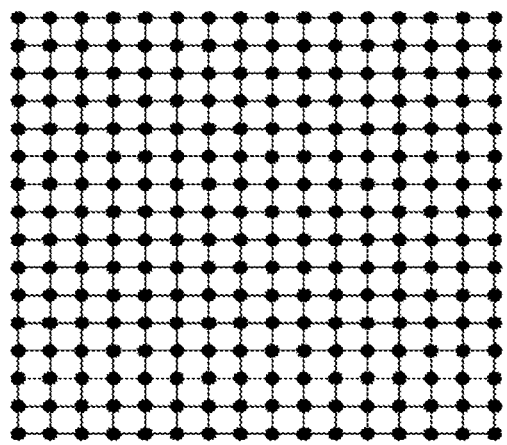

The Z map generating unit 212 generates a Z map by combining the Z map of the peripheral portion R2 generated in step S103 and the Z map of the central portion R1 generated in step S105 (step S106). For example, a Z map is generated in which 16×16 Z values are aligned as illustrated in FIG. 7C. The generated Z map is stored in the storage device 204.

Figure 8:
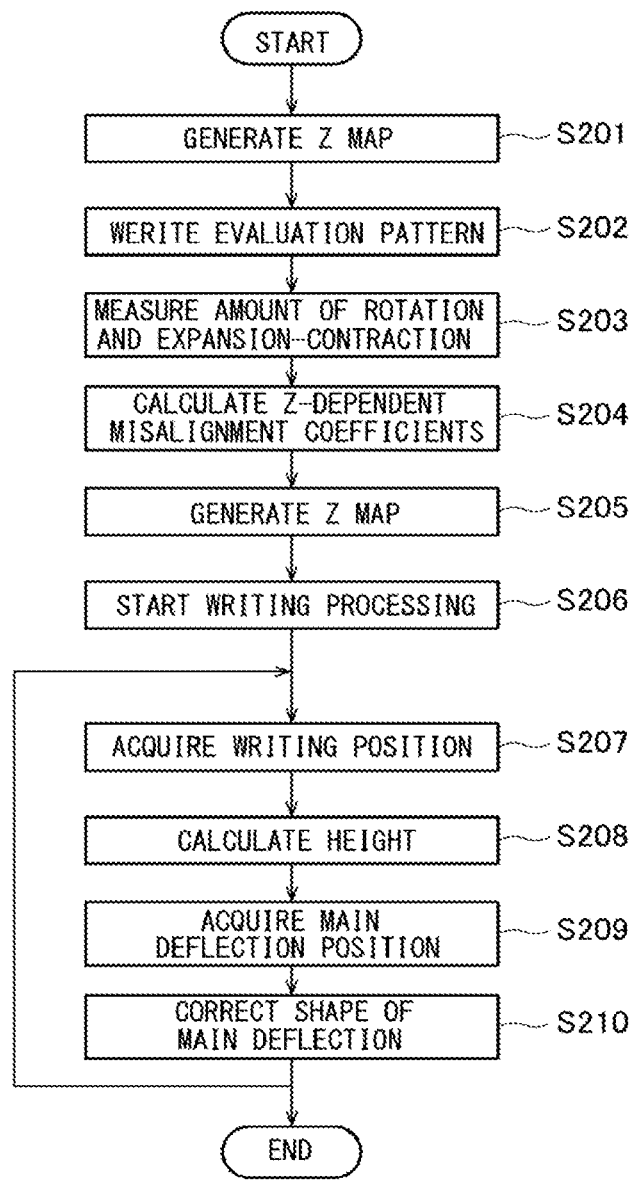
FIG. 8 is a flow chart for describing a writing method according to the embodiment.

Next, a writing method according to the present embodiment will be described using the flow chart illustrated in FIG. 8. In the flow chart of FIG. 8, steps S201 to S204 are pre-processing performed before the start of writing.

Figure 4:
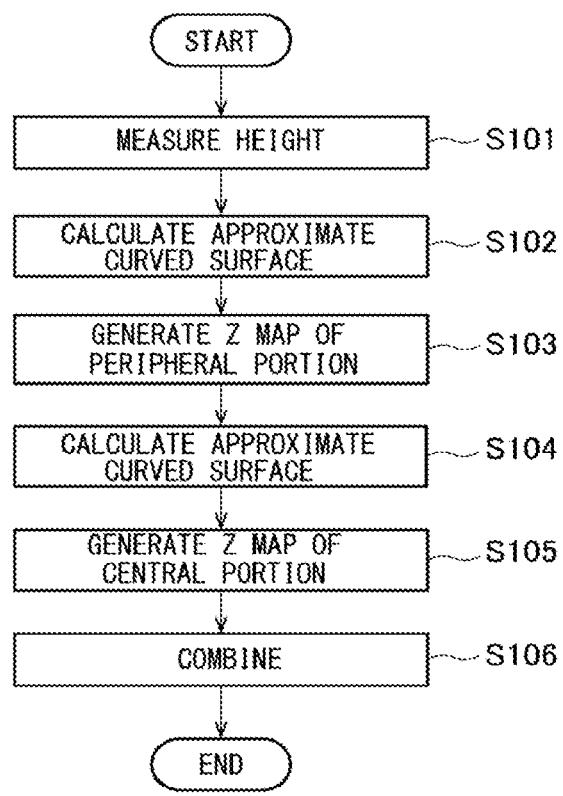
FIG. 4 is a flow chart for describing a Z map generation method according to the embodiment.
Figure 5:
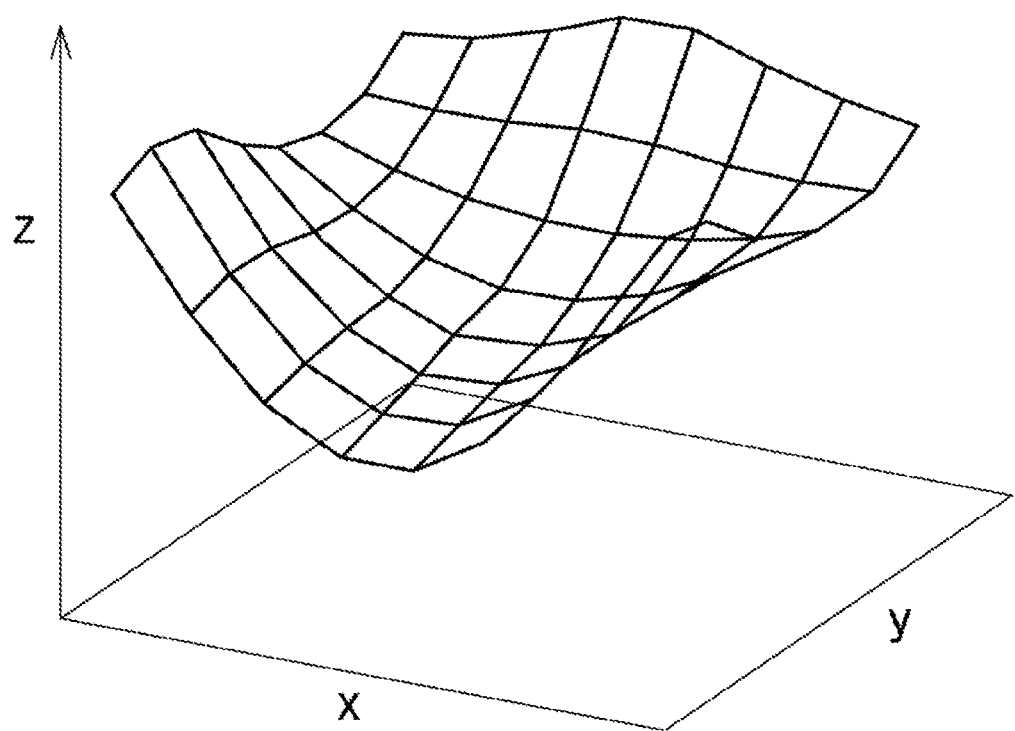
FIG. 5 is a diagram illustrating an example of a measurement result of the height of a surface of a substrate.

First, an evaluation board is placed on the XY stage 140, and a Z map of the evaluation board is generated using the method illustrated in FIG. 4 (step S201).

Next, an evaluation pattern is written on the evaluation board (step S202). The shot data generating unit 214 reads out writing data of the evaluation pattern from the storage device 202, and generates shot data unique to the device by performing multi-stage data conversion processing. The shot data includes, on a shot-by-shot basis, for example a graphic code, which indicates a graphic type of each shot graphic form, a graphic size, a shot position, and an irradiation time. The shot data is temporarily stored in a memory (not illustrated). The writing control unit 216 outputs the shot data to the deflection control unit 220.

The deflection control unit 220 generates, on the basis of the shot data, a deflection signal for controlling the deflectors 130, 132, 134, and 136. The deflection signal is D/A converted and then amplified by a digital-to-analog converter (DAC) amplifier, which is not illustrated, and is applied to electrodes of the deflectors 130, 132, 134, and 136. As a result, a desired position on the evaluation board can be irradiated with an electron beam having a desired shape for a desired irradiation time (the amount of irradiation). Note that the evaluation pattern is written in a state in which the evaluation board is staying still. The evaluation pattern may be a line pattern or may also be a hole pattern.

The position of the written evaluation pattern is measured, and the amount of rotation and the amount of expansion-contraction of the main deflection area are measured (step S203). For example, for measurement positions of the written evaluation pattern, the amount of rotation and the amount of expansion-contraction of the main deflection area can be calculated at each position by performing fitting using a linear function with two variables x and y.

Z-dependent misalignment coefficients A1, A2, B1, and B2 are calculated from the Z map generated in step S201 and the amount of rotation and the amount of expansion-contraction of the main deflection area at each position and calculated in step S203 (step S204), the coefficients indicating the extent to which the shape of the main deflection area rotates and expands or contracts when the height of the surface of the substrate changes. The calculated coefficients A1, A2, B1, and B2 are used in a correction formula to be described below and are stored in the storage device 206.

In addition, correction coefficients a0 to a9 and b0 to b9 for correcting distortion of the main deflection area corresponding to the writing position are calculated and stored in the storage device 206. For example, by moving the XY stage 140, a mark (not illustrated) on the stage is moved to each desired position in the main deflection area. The mark position is then measured by deflecting an electron beam to each position in the main deflection area, and a residual thereof is obtained. The coefficients a0 to a9 and b0 to b9 are then calculated by performing fitting on the obtained residuals using a relational expression with variables x and y. The coefficients a0 to a9 and b0 to b9 are also used in the correction formula to be described below.

After the correction coefficients are obtained, actual writing is performed on the substrate 150, which is a writing target. Writing data of a pattern to be written on the substrate 150 is input to, from outside, and stored in the storage device 202.

A Z map of the substrate 150 is generated using the method illustrated in FIG. 4 (step S205). The Z map is stored in the storage device 204.

Writing processing is started (step S206). For example, the shot data generating unit 214 reads out writing data from the storage device 202, and generates shot data unique to the device by performing multi-stage data conversion processing. In order to write graphic patterns using the writing apparatus, each graphic pattern defined in the writing data needs to be divided into sizes each of which can be irradiated with one beam shot. Thus, the shot data generating unit 214 generates shot graphics by dividing the graphic pattern indicated by the writing data into sizes each of which can be irradiated with one beam shot. For each shot graphic, shot data is generated. In the shot data, for example, the type of graphic, a graphic size, an irradiation position, and the amount of irradiation are defined. The pieces of generated shot data are sequentially and temporarily stored in a memory (not illustrated).

The writing control unit 216 outputs the shot data to the deflection control unit 220. The deflection control unit 220 generates, on the basis of the shot data, a deflection signal for controlling each deflector.

The writing control unit 216 outputs a speed command signal to the stage control unit 230, so that a stage speed corresponding to the density of the writing pattern is achieved. The stage control unit 230 controls the speed of the XY stage 140 on the basis of the speed command signal.

The correction unit 218 acquires a writing position (a beam irradiation position) x, y from the shot data output to the deflection control unit 220 (step S207).

The correction unit 218 calculates, from the Z map, the height of the surface of the substrate z=Z map (x, y) at the writing position x, y (step S208). The correction unit 218 calculates the height at the writing position x, y by linear interpolation using values defined on the Z map. By the linear interpolation, discontinuity due to the difference in the orders of approximate polynomials of the central portion R1 and the peripheral portion R2 is corrected.

From the shot data, a position mx, my (A main deflection position. A writing starting point of a sub-deflection area.) to which an electron beam is deflected by the main deflector 134 is acquired (step S209).

A DAC value (a value to be output to a DAC (not illustrated) that determines a voltage value to be set in the main deflector 134) is calculated using the following correction formula, and the shape of the main deflection area is corrected (step S210).

DAC value $X = a0 + (a1 + A1*z)mx + (a2 + A2*z)my + a3*mx^2 + \ldots + a9*my^3$

DAC value $Y = b0 + (b1 + B1*z)mx + (b2 + B2*z)my + b3*mx^2 + \ldots + b9*my^3$

On the basis of the calculated correction amount for the shape of the main deflection area, the writing control unit 216 controls the objective lens 116, adjusts the focal position, corrects rotation and expansion-contraction of the main deflection area, and performs writing processing.

According to the present embodiment, for the central portion R1 of the substrate, the surface-height actual measured values in the central portion R1 are approximated using the high-order polynomial, and the Z map is generated on the basis of this high-order polynomial. In addition, for the peripheral portion R2 of the substrate, the surface height of which cannot be measured, the surface-height actual measured values in the central portion R1 are approximated using the low-order polynomial, and the Z map is generated by extrapolation using this low-order polynomial. The Z map of the central portion R1 and the Z map of the peripheral portion R2 are then combined. The combined Z map prevents errors in the peripheral portion R2 from increasing, and the errors from the actual measured values of the central portion R1 are significantly small.

The use of such a Z map can calculate the height of a substrate surface with high accuracy, perform focal position adjustment and so on with high accuracy, and reduce a shift in the writing position of a beam.

Figure 9:
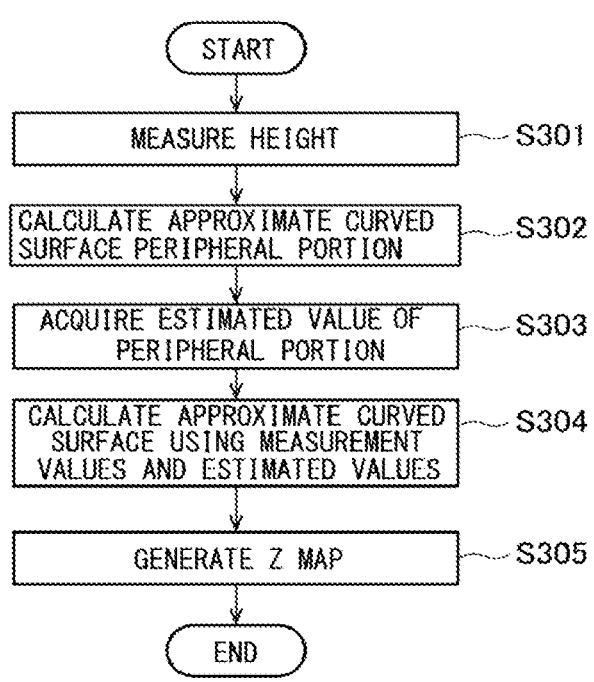
FIG. 9 is a flow chart for describing a Z map generation method according to another embodiment.

FIG. 9 is a flow chart for describing a Z map generation method according to another embodiment.

Figure 10A:
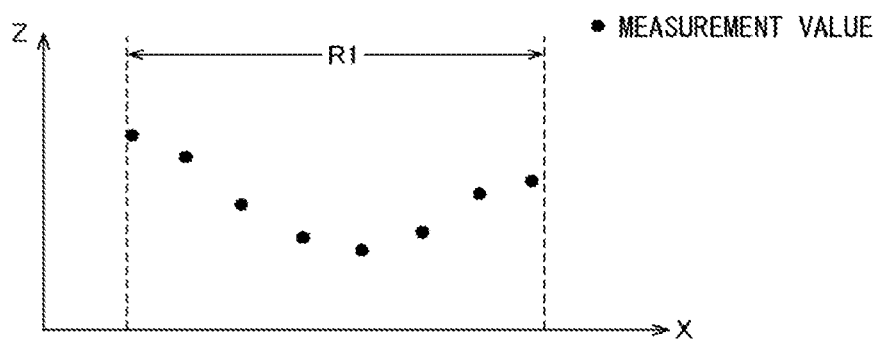
FIG. 10A illustrates an example of a measurement result of the height of the surface of the substrate.

The height of the surface of the substrate 150 is measured at a plurality of points on the surface using the Z sensor 160 (step S301). For example, the height of the central portion R1 of the substrate 150 is measured at 8×8 points. FIG. 10A illustrates an example of measurement values.

Figure 10B:
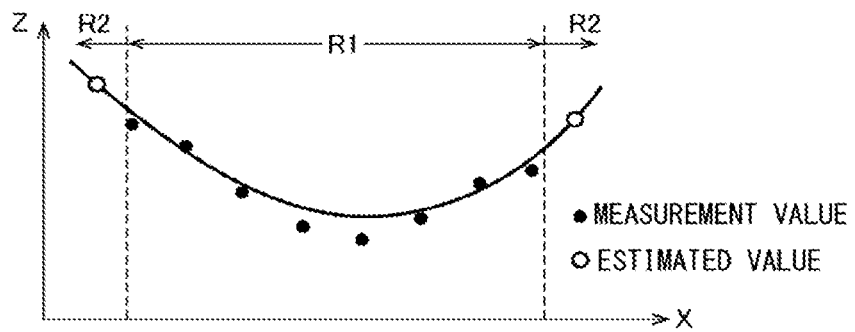
FIG. 10B illustrates estimated values of the height of the surface of a peripheral portion.

As illustrated in FIG. 10B, fitting is performed using a low-order polynomial on the measurement values obtained in step S301, and an approximate curved surface is calculated (step S302). Estimated values of the height of the surface of the peripheral portion R2 are obtained using this approximate curved surface (step S303).

Figure 10C:
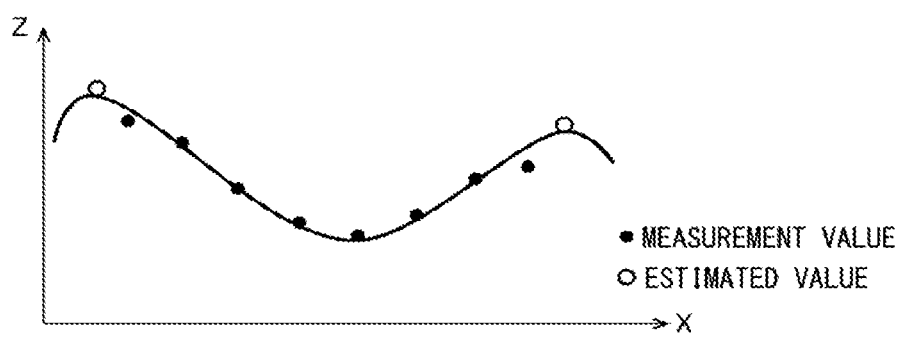
FIG. 10C is a diagram illustrating an approximate polynomial.

As illustrated in FIG. 10C, the measurement values obtained in step S301 and the estimated values obtained in step S303 are combined, fitting is performed on the measurement values and the estimated values using a high-order polynomial, and an approximate curved surface is calculated (step S304), and a Z map is generated by interpolation using this approximate curved surface (step S305).

In this manner, the Z map can be generated with high accuracy also by estimating the height of the surface of the peripheral portion R2 using the low-order polynomial with which the measurement values of the height of the surface are approximated and then by approximating the measurement values and estimated values using the high-order polynomial.

Figure 11:
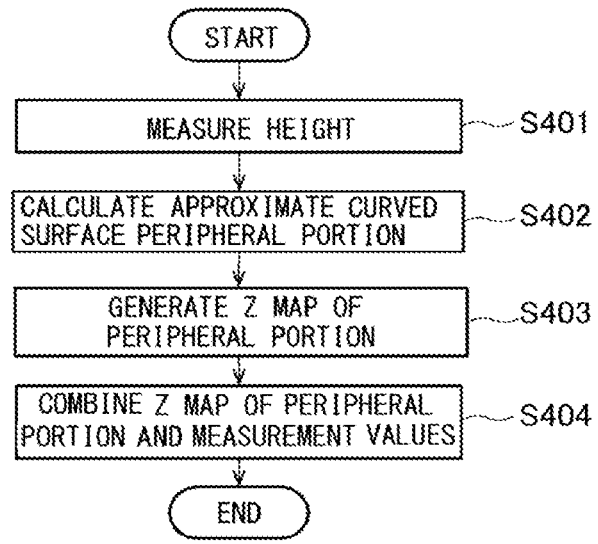
FIG. 11 is a flow chart for describing a Z map generation method according to another embodiment.

FIG. 11 is a flow chart for describing a Z map generation method according to still another embodiment.

The height of the surface of the substrate 150 is measured at a plurality of points on the surface using the Z sensor 160 (step S401). For example, the height of the central portion R1 of the substrate 150 is measured at 14×14 points.

Fitting is performed using a low-order polynomial on the measurement values obtained in step S401 and an approximate curved surface is calculated (step S402), and a Z map of the peripheral portion R2 is generated by extrapolation using this approximate curved surface (step S403).

A Z map is generated by combining the measurement values obtained in step S401 and the Z map of the peripheral portion R2 generated in step S403 (step S404).

The Z map can be generated with high accuracy also by increasing the number of points at which the height of the surface of the central portion R1 is measured by the Z sensor 160 and by using the measurement values as a Z map of the central portion R1 as they are. In addition, in a case where fitting is performed using a high-order polynomial on the measurement data of the central portion R1, and estimated values or a map is obtained by extrapolating the peripheral portion R2 using a low-order polynomial, the outermost peripheral data of R1 obtained by performing fitting on the measurement data may also be used as is as the innermost peripheral data of the peripheral portion R2.

While certain embodiments have been described, these embodiments have been presented by way of example only, and are not intended to limit the scope of the inventions. For example, although the above embodiments employ the variable formation beam that is shaped at each shot and is irradiated, a beam having a definite shape may be irradiated. A plurality of beams can be irradiated simultaneously. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing apparatus comprising:
   a writer writing a pattern on a surface of a substrate using a charged particle beam;

a measurement unit measuring a height of the surface of a central portion of the substrate at a plurality of positions in the central portion;

a generator performing fitting using a first polynomial on measurement values from the measurement unit, calculating, by extrapolation using the first polynomial, a first height distribution of the height of the surface of a peripheral portion of the substrate, performing fitting using a second polynomial, which is of a higher order than the first polynomial, on the measurement values, calculating a second height distribution of the height of the surface of the central portion by interpolation using the second polynomial, and generating a height distribution of the substrate by combining the first height distribution and the second height distribution; and a controller adjusting a focal position of the charged particle beam based on the height of the surface at a writing position, the height being calculated from the height distribution of the substrate.

2. The apparatus according to claim 1, wherein an outermost peripheral measurement value of the central portion of the substrate is used as the height of an innermost peripheral surface of the peripheral portion of the substrate.

3. The apparatus according to claim 1, wherein the first polynomial is a cubic polynomial and the second polynomial is a sextic polynomial.

4. A charged particle beam writing apparatus comprising:

a writer writing a pattern on a surface of a substrate using a charged particle beam;

a measurement unit measuring a height of the surface of a central portion of the substrate at a plurality of positions in the central portion;

a generator performing fitting using a first polynomial on measurement values from the measurement unit, calculating, by extrapolation using the first polynomial, an estimated value of the height of the surface of a peripheral portion of the substrate, performing fitting using a second polynomial, which is of a higher order than the first polynomial, on the measurement values and the estimated value, and generating a height distribution of the substrate based on the second polynomial; and a controller adjusting a focal position of the charged particle beam based on the height of the surface at a writing position, the height being calculated from the height distribution of the substrate.

5. The apparatus according to claim 4, wherein an outermost peripheral measurement value of the central portion of the substrate is used as the height of an innermost peripheral surface of the peripheral portion of the substrate.

6. The apparatus according to claim 4, wherein the first polynomial is a cubic polynomial and the second polynomial is a sextic polynomial.

7. A charged particle beam writing method for writing a pattern on a surface of a substrate using a charged particle beam, the method comprising:

measuring a height of the surface of a central portion of the substrate at a plurality of positions in the central portion;

performing fitting using a first polynomial on measurement values from the measuring, and calculating, by extrapolation using the first polynomial, a first height distribution of the height of the surface of a peripheral portion of the substrate;

performing fitting using a second polynomial, which is of a higher order than the first polynomial, on the measurement values, and calculating a second height distribution of the height of the surface of the central portion by interpolation using the second polynomial;

generating a height distribution of the substrate by combining the first height distribution and the second height distribution; and adjusting a focal position of the charged particle beam based on the height of the surface at a writing position, the height being calculated from the height distribution of the substrate.

8. The method according to claim 7, wherein an outermost peripheral measurement value of the central portion of the substrate is used as the height of an innermost peripheral surface of the peripheral portion of the substrate.

9. The method according to claim 7, wherein the first polynomial is a cubic polynomial and the second polynomial is a sextic polynomial.

* * * * *